(12) United States Patent
Muthukamatchi et al.

(10) Patent No.: US 11,850,742 B2
(45) Date of Patent: Dec. 26, 2023

(54) DUAL ROBOT INCLUDING SPLAYED END EFFECTORS AND SYSTEMS AND METHODS INCLUDING SAME

(71) Applicant: Applied Materials, Inc., Santa Clara, CA (US)

(72) Inventors: Karuppasamy Muthukamatchi, Madurai (IN); Jeffrey C. Hudgens, San Francisco, CA (US); Damon K. Cox, Jarrell, TX (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 16/850,590

(22) Filed: Apr. 16, 2020

(65) Prior Publication Data
US 2020/0384635 A1 Dec. 10, 2020

(30) Foreign Application Priority Data
Jun. 7, 2019 (IN) .............................. 201941022652

(51) Int. Cl.
*B25J 9/04* (2006.01)
*B25J 9/06* (2006.01)
(Continued)

(52) U.S. Cl.
CPC ............... *B25J 9/04* (2013.01); *B25J 9/0009* (2013.01); *B25J 9/06* (2013.01); *B25J 17/02* (2013.01); *B25J 15/0014* (2013.01)

(58) Field of Classification Search
CPC ..... B25J 9/04; B25J 9/0009; B25J 9/06; B25J 15/0014; B25J 17/02; H02K 21/67742
(Continued)

(56) References Cited

U.S. PATENT DOCUMENTS 5,096,364 A   1/1992  Messer et al.
6,102,649 A   8/2000  Ogawa
(Continued)

FOREIGN PATENT DOCUMENTS

CN   1332667 A    1/2002
CN   103503127 A  1/2014
(Continued)

OTHER PUBLICATIONS

International Search Report and Written Opinion for International Application No. PCT/US2020/036309, dated Sep. 17, 2020, 11 pages.
(Continued)

*Primary Examiner* — William C Joyce
(74) *Attorney, Agent, or Firm* — Lowenstein Sandler LLP

(57) ABSTRACT

A robot may include a first arm assembly including a first upper arm rotatable about a first axis; a first forearm adapted for rotation relative to the first upper arm about a second axis; a first wrist member adapted for rotation relative to the first forearm about a third axis; and a first end effector coupled to the first wrist member, wherein the first end effector is moveable along a first path. A second arm assembly may include a second upper arm rotatable about the first axis; a second forearm adapted for rotation relative to the second upper arm about a fourth axis; a second wrist member adapted for rotation relative to the second forearm; and a second end effector coupled to the second wrist member, wherein the second end effector is moveable along a second path that does not overlap the first path. Other apparatus and methods are disclosed.

19 Claims, 7 Drawing Sheets

(51) Int. Cl.
  *B25J 17/02* (2006.01)
  *B25J 9/00* (2006.01)
  *B25J 15/00* (2006.01)

(58) Field of Classification Search
  USPC .......................................................... 414/935
  See application file for complete search history.

(56) References Cited

U.S. PATENT DOCUMENTS

| | | | |
|---|---|---|---|
| 6,109,860 A | 8/2000 | Ogawa | |
| 6,121,743 A | 9/2000 | Genov et al. | |
| 6,224,319 B1 | 5/2001 | Velikov et al. | |
| 7,688,017 B2 | 3/2010 | Hudgens | |
| 7,927,062 B2 | 4/2011 | Rice et al. | |
| 8,016,542 B2 | 9/2011 | Cox et al. | |
| 8,061,232 B2 | 11/2011 | Kroetz et al. | |
| 8,137,048 B2 * | 3/2012 | Chidambaram | H01L 21/67184 414/744.2 |
| 8,264,187 B2 | 9/2012 | Laceky et al. | |
| 8,692,500 B2 | 4/2014 | Laceky et al. | |
| 8,777,547 B2 | 7/2014 | Kremerman et al. | |
| 8,784,033 B2 | 7/2014 | Kremerman et al. | |
| 8,918,203 B2 * | 12/2014 | Gilchrist | B25J 11/0095 414/744.1 |
| 9,076,829 B2 | 7/2015 | Brodine et al. | |
| 9,076,830 B2 | 7/2015 | Kremerman et al. | |
| 9,147,590 B2 | 9/2015 | Pietrantonio et al. | |
| 9,149,936 B2 * | 10/2015 | Hosek | B25J 15/0052 |
| 10,500,719 B2 | 12/2019 | Muthukamatchi et al. | |
| 10,850,390 B2 * | 12/2020 | Muthukamatchi | H01L 21/67184 |
| 2010/0178146 A1 | 7/2010 | Kremerman et al. | |
| 2012/0213615 A1 | 8/2012 | Sakaue | |
| 2013/0115028 A1 | 5/2013 | Kremerman et al. | |
| 2013/0121798 A1 | 5/2013 | Hosek | |
| 2013/0149076 A1 | 6/2013 | Cox et al. | |
| 2013/0272823 A1 | 10/2013 | Hudgens et al. | |
| 2014/0010625 A1 | 1/2014 | Hudgens et al. | |
| 2014/0150592 A1 | 6/2014 | Kremerman | |
| 2014/0154038 A1 | 6/2014 | Hudgens et al. | |
| 2014/0271055 A1 | 9/2014 | Weaver et al. | |
| 2014/0286736 A1 | 9/2014 | Kremerman et al. | |
| 2014/0286741 A1 | 9/2014 | Kremerman et al. | |
| 2014/0365004 A1 | 12/2014 | Hosek et al. | |
| 2015/0190933 A1 | 7/2015 | Kremerman | |
| 2016/0167229 A1 * | 6/2016 | Hosek | H01L 21/68735 74/490.06 |
| 2016/0329234 A1 | 11/2016 | Krupyshev et al. | |
| 2017/0117171 A1 | 4/2017 | Wirth | |
| 2017/0115555 A1 | 8/2017 | Hofmann et al. | |
| 2017/0294335 A1 * | 10/2017 | Kato | B25J 9/043 |
| 2017/0368680 A1 * | 12/2017 | Muthukamatchi | H01L 21/67184 |
| 2018/0138066 A1 | 5/2018 | Caveney et al. | |
| 2019/0054612 A1 | 2/2019 | Kremerman | |

FOREIGN PATENT DOCUMENTS

| | | |
|---|---|---|
| JP | 05-100199 A | 4/1993 |
| JP | H11-188670 A | 7/1999 |
| JP | H11/188671 A | 7/1999 |
| JP | H11-291184 A | 10/1999 |
| JP | 2001-332599 A | 11/2001 |
| JP | 2002-172571 A | 6/2002 |
| JP | 2002172571 A | 6/2002 |
| JP | 2002-362738 A | 12/2002 |
| JP | 2016-505219 A | 2/2016 |
| JP | 2011-077399 A | 4/2021 |
| KR | 1020070021310 | 2/2007 |
| KR | 10-1382145 B1 | 4/2014 |
| WO | 2013154863 A1 | 10/2013 |
| WO | 2014085479 A1 | 6/2014 |
| WO | 2014113364 A1 | 7/2014 |
| WO | 2014165300 A1 | 10/2014 |
| WO | 2016056119 A1 | 4/2016 |

OTHER PUBLICATIONS

Chinese Search Report of Chinese Application No. 2017800408949 dated Nov. 8, 2021, 23 pages.
Taiwan Search Report of Taiwan Application No. 109131615 dated Dec. 21, 2020, 6 pages.
Taiwan Search Report of Taiwan Application No. 106118782 dated Aug. 5, 2020, 6 pages.
International Search Report and Written Opinion for International Application No. PCT/US2017/036902, dated Sep. 4, 2017, 11 pages.
International Preliminary Report on Patentability of International Application No. PCT/US2017/036902 dated Jan. 10, 2019, 10 pages.
International Preliminary Report on Patentability of International Application No. PCT/US2020/036309 dated Dec. 7, 2021, 7 pages.
Chinese Office Action of Chinese Application No. 201780040894.9 dated Mar. 23, 2022, 19 pages.
Chinese Office Action of Chinese Application No. 201780040894.9 dated Jan. 19, 2022, 31 pages.
Chinese Search Report of Chinese Application No. 201780040894.9 dated Nov. 8, 2021, 35 pages.
Chinese Office Action of Chinese Application No. 201780040894.9 dated May 19, 2021, 15 pages.

* cited by examiner

DUAL ROBOT INCLUDING SPLAYED END EFFECTORS AND SYSTEMS AND METHODS INCLUDING SAME

RELATED APPLICATIONS

This application claims the benefit under 35 U.S.C. § 119(a) of Indian Provisional Patent Application No. 201941022652, filed Jun. 7, 2019, in the Indian Patent Office.

FIELD

Embodiments of the present disclosure relate to electronic device manufacturing, and more specifically to robots adapted to transport substrates between chambers.

BACKGROUND

Electronic device manufacturing systems can include process tools having multiple chambers, such as process chambers and one or more load lock chambers. Such process chambers may be used to carry out any number of processes on substrates (e.g., silicon-containing wafers, both patterned and unpatterned, masked wafers, glass plates, silica-containing articles, and the like) such as deposition, oxidation, nitration, etching, diffusing, growing, implanting, polishing, cleaning, lithography, metrology, and the like.

Within such process tools, a plurality of such chambers may be distributed about a transfer chamber, for example. A robot may be at least partially contained within the transfer chamber and may be configured and adapted to transport substrates between the various chambers. For example, transfers may be between process chambers, or between process chambers and the one or more load lock chambers.

SUMMARY

In some embodiments, a robot is provided. The robot includes a first arm assembly including: a first upper arm rotatable about a first axis; a first forearm adapted for rotation relative to the first upper arm about a second axis at a position spaced from the first axis; a first wrist member adapted for rotation relative to the first forearm about a third axis at a position spaced from the second axis; and a first end effector coupled to the first wrist member, wherein the first end effector is moveable along a first path. The robot further includes a second arm assembly including: a second upper arm rotatable about the first axis; a second forearm adapted for rotation relative to the second upper arm about a fourth axis at a position spaced from the first axis; a second wrist member adapted for rotation relative to the second forearm about a fifth axis at a position spaced from the fourth axis; and a second end effector coupled to the second wrist member, wherein the second end effector is moveable along a second path and wherein the first path and the second path do not overlap.

In other embodiments, an electronic device processing system is provided. The electronic device processing system includes: a transfer chamber; a robot at least partially disposed in the transfer chamber and adapted to transport substrates to and from process chambers coupled to the transfer chamber, the robot including: a first arm assembly including: a first upper arm rotatable about a first axis; a first forearm adapted for rotation relative to the first upper arm about a second axis at a position spaced from the first axis; a first wrist member adapted for rotation relative to the first forearm about a third axis at a position spaced from the second axis; and a first end effector coupled to the first wrist member, wherein the first end effector is moveable along a first path. The robot also includes a second arm assembly including: a second upper arm rotatable about the first axis; a second forearm adapted for rotation relative to the second upper arm about a fourth axis at a position spaced from the first axis; a second wrist member adapted for rotation relative to the second forearm about a fifth axis at a position spaced from the fourth axis; and a second end effector coupled to the second wrist member, wherein the second end effector is moveable along a second path and wherein the first path and the second path do not overlap.

In other embodiments, a method of transporting substrates within an electronic device processing system is provided. The method includes rotating a first upper arm of a first arm assembly of a robot, wherein the rotating causes the end effector of the first arm assembly to move along a first path; and rotating a second upper arm of a second arm assembly of the robot, wherein the rotating causes a second end effector of the second arm assembly to move along a second path, wherein the first end effector and the second end effector do not overlap when moving along the respective first and second paths.

DETAILED DESCRIPTION

Electronic device manufacturing processing seeks precise and rapid transport of substrates between various locations (e.g., between chambers). To improve processing speed, dual-bladed selective compliance assembly robot arm (SCARA) robots have been used, i.e., robots having two blades, one above the other, wherein substrate exchanges (pick and place) at a chamber can take place rapidly and without making a rotational move. In particular, a pick is accomplished by one end effector and a place is accomplished by the other end effector of the dual-bladed SCARA robot from a particular chamber without a rotational move. Once the exchange has taken place, the SCARA robot can be rotated to another chamber where another exchange (pick and place) can be accomplished.

Such existing SCARA robots may provide an acceptable level of throughput and precision. The dual SCARA robots may have a first arm assembly located lower than an upper or second arm assembly. In such dual SCARA robots a component of the upper arm assembly and/or a substrate carried by the upper arm assembly may move over a substrate carried by the lower arm assembly. Such movements make the substrate carried by the lower arm assembly susceptible to contamination from debris or liquids and the like falling from, or generated by, the upper arm assembly and/or the substrate carried by the upper arm assembly.

Embodiments of the present disclosure provide a dual-blade robot that includes a configuration where components of the upper arm assembly (including upper arm, forearm, and wrist) do not pass over a lower substrate and wherein the proximity of the components to the lower substrate is enlarged. Embodiments of the present disclosure also provide a dual-blade robot that includes configurations where the upper substrate carried by the upper arm assembly does not pass over a lower substrate. This robot configuration enables the substrates to be transferred with a reduced likelihood of particle contamination. Semiconductor devices are sensitive to particle contamination due to device size reduction and sensitivities to lower voltage levels and the like. For example, particle contamination may cause electrical instability, gate oxide integrity degradation, shift of voltage threshold of transistor device, pad corrosion, and many other risks to semiconductor devices. Accordingly, to reduce particle contamination is to avoid possible defects in semiconductor devices produced during device processing. Further details of various aspects of the robot, electronic device processing systems including the robot, and methods of operating the robot according to example embodiments are described with reference to FIGS. 1-3 herein.

Figure 1:
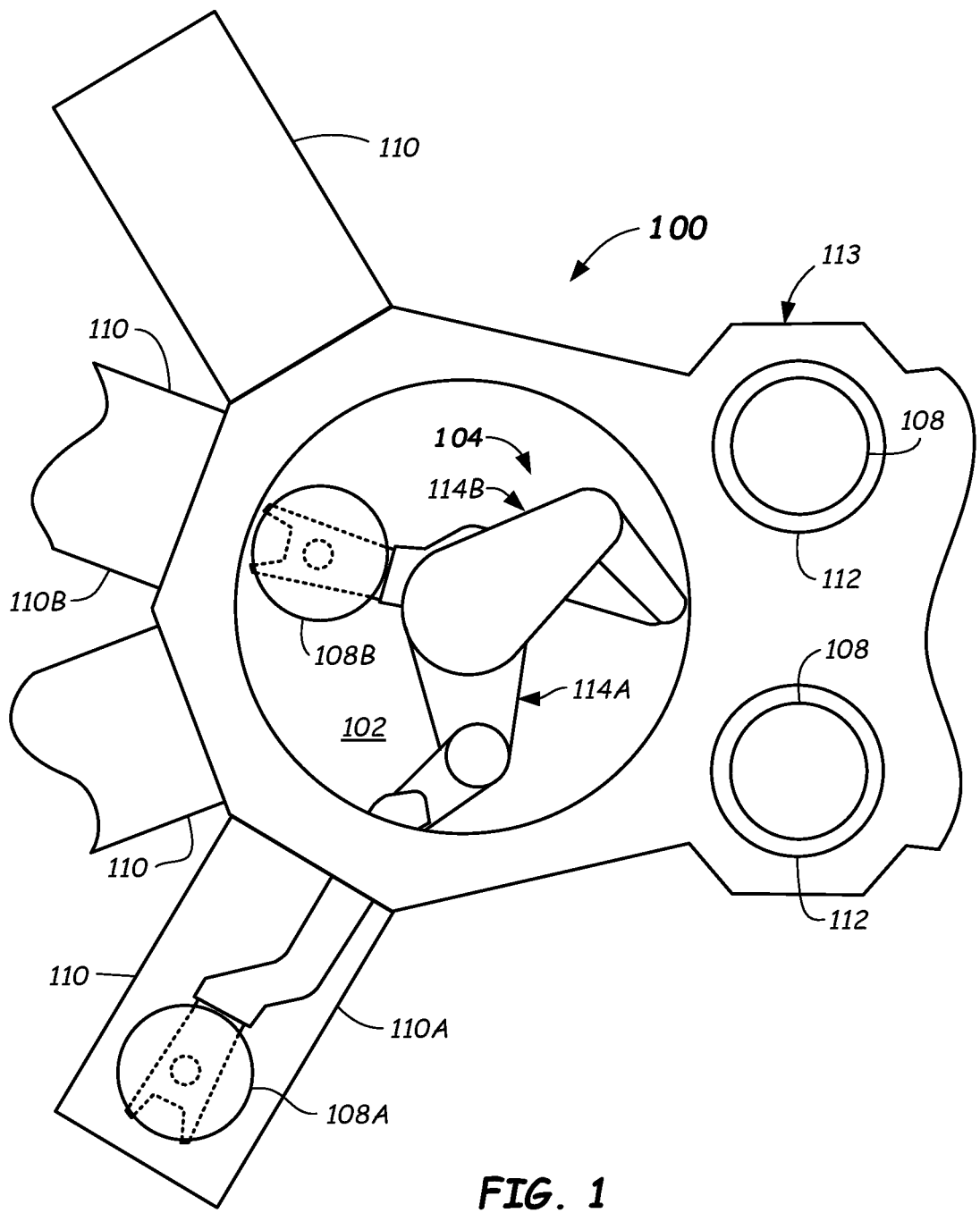
FIG. 1 illustrates a top plan view of an electronic device processing system (with lids removed) including a dual robot with splayed end effectors according to one or more embodiments of the disclosure.

Referring now to FIG. 1, in some embodiments, an electronic device processing system 100 is provided. The electronic device processing system 100 may include a transfer chamber 102 and a robot 104 (e.g., a splayed dual robot in accordance with another embodiment of this disclosure) at least partially contained in the transfer chamber 102, wherein the robot 104 is configured to transport substrates 108 to and from process chambers 110 and load lock chambers 112. The robot 104 is constructed as described herein. At least partially contained means that some portions of the robot 104 may be outside of the transfer chamber, such as the motor housing thereof. The various arms and end effectors of the robot 104 are located in the transfer chamber 102.

The electronic device processing system 100 includes a mainframe housing 113 including and defining the transfer chamber 102 (lids/covers removed for illustration purposes). The transfer chamber 102 may include top, bottom, and side walls, and, in some embodiments, may be maintained at a vacuum, for example. As shown in FIG. 1, the top (e.g., lid) is removed. The destination locations for pick or place of the substrates 108, 108A, 108B may be any of the process chambers 110 and/or any of the load lock chambers 112.

The robot 104 is shown in FIG. 1 placing a first substrate 108A in first process chamber 110A of the process chambers 110 using a first arm assembly 114A of the robot 104. The robot 104 is also shown having picked or preparing to place a second substrate 108B into a second process chamber 110B of the chambers 110 using a second arm assembly 114B of the robot. In some embodiments, the robot 104 may pick and/or place substrates 108A, 108B out of, or into, processing chambers 110 simultaneously, and/or out of or into load lock chambers 112 simultaneously, and/or non-simultaneously out of, or into, a load lock chamber 112 and/or a processing chamber 110 non-simultaneously.

The various process chambers 110 may be adapted to carry out any number of processes on the substrates 108, such as deposition, oxidation, nitration, etching, diffusing, growing, implanting, polishing, cleaning, lithography, metrology, and the like. Other processes may be carried out. The load lock chambers 112 may be adapted to interface with a factory interface (otherwise referred to as an equipment front end module or EFEM—not shown) or other system component that may receive substrates 108 from one or more substrate carriers (e.g., Front Opening Unified Pods (FOUPs)) docked at one or more load ports of the factory interface or otherwise.

Because of the substantial lack of path interference between the first arm assembly 114A and the second arm assembly 114B of the robot 104, the substrate transfers between process chambers 110 and load lock chambers 112 can be made with a minimal risk of particle or other contamination (e.g., lubricating medium, such as oil). Moreover, substrate transfers can be made by each of the first end effector 224 (FIGS. 2A-2C) and the second end effector 232 (FIGS. 2A-2C) such that one substrate 108B does not directly lie over the other substrate 108A. Such a configuration reduces the risk that any contamination may fall from the second substrate 108B and come to rest on the first substrate 108A. The first arm assembly 114A and the second arm assembly 114B may be operable to extend and retract in unison in some embodiments, albeit they need not be.

In the depicted embodiment of FIG. 1, the robot 104 is shown as having arms operable in the transfer chamber 102. However, it should be recognized that this embodiment of the robot 104 may optionally or additionally be used in other areas of electronic device manufacturing, such as in a factory interface where the robot 104 may transport substrates between one or more load ports, substrate carriers, side storage pods, or other system components and the load lock chambers 112, for example. The robot 104 described herein may be capable of other transporting uses.

Figure 2A:
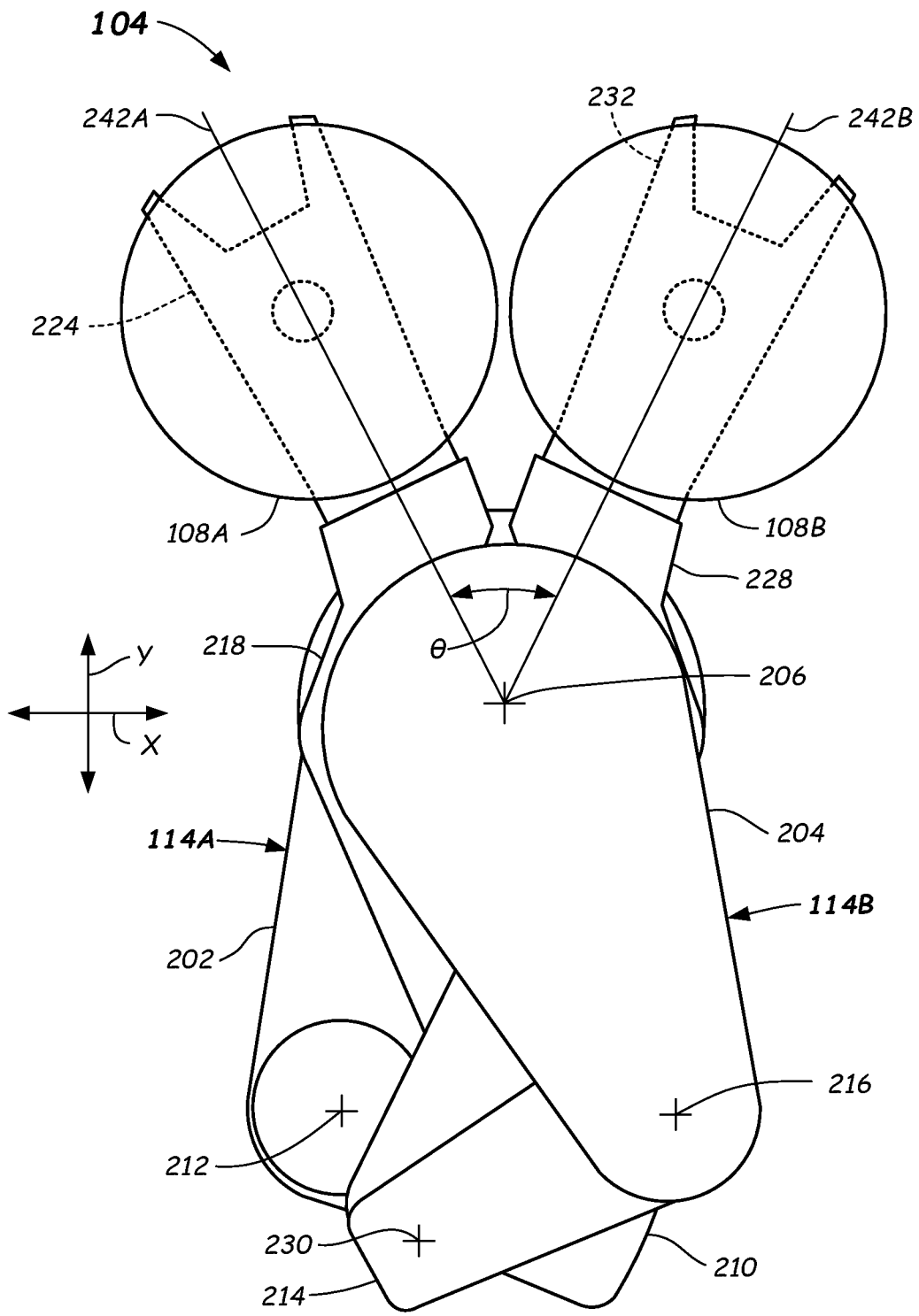
FIG. 2A illustrates a top plan view of a dual robot in a retracted (and splayed) configuration according to one or more embodiments of the disclosure.
Figure 2B:
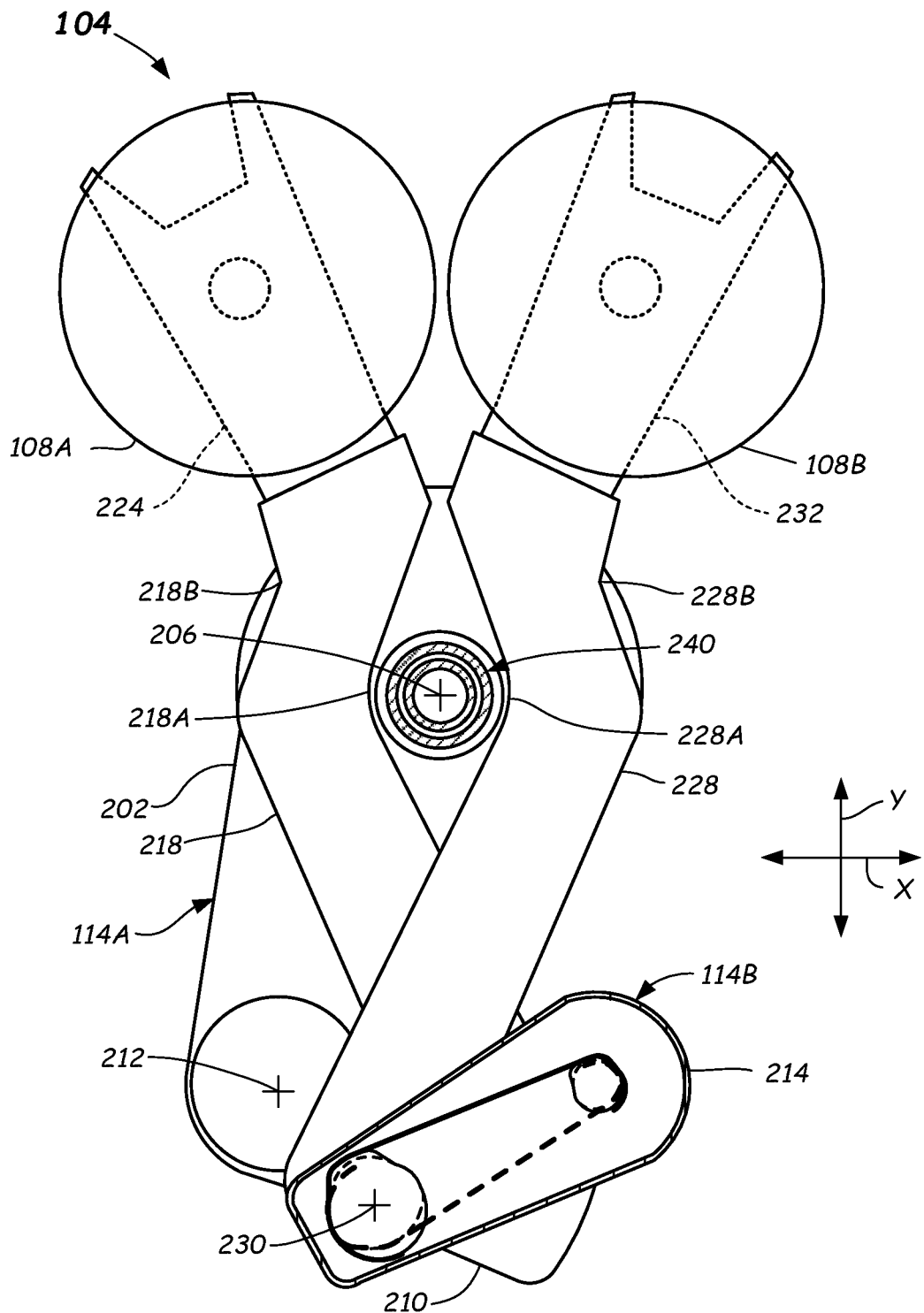
FIG. 2B illustrates a top partially cross-sectioned view of a dual robot with an upper arm and forearm lid removed to illustrate the retracted (and splayed) and the wrist member drive assembly configuration of the dual robot according to one or more embodiments of the disclosure.
Figure 2C:
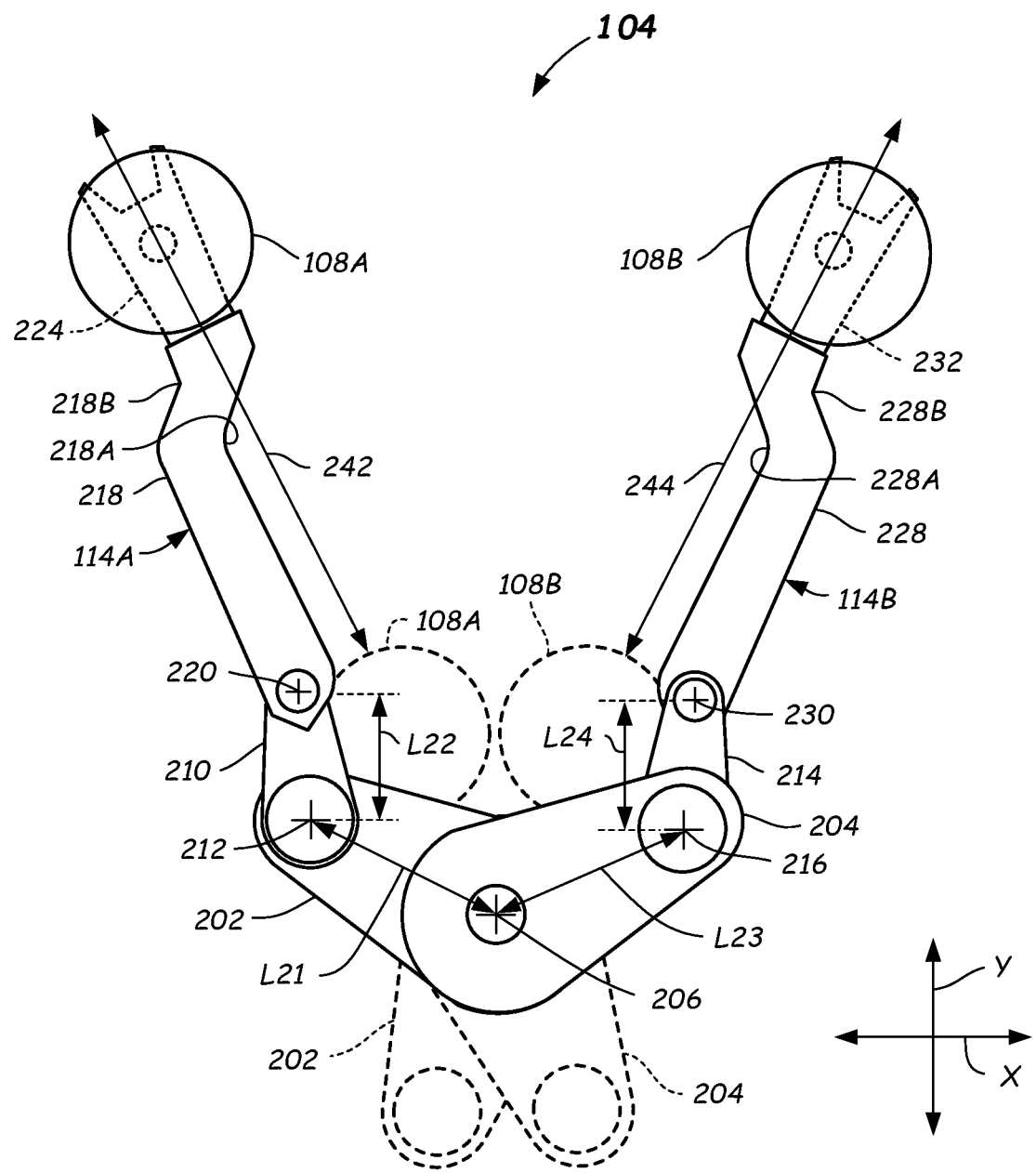
FIG. 2C illustrates a top plan view of a dual robot showing both an extended and retracted (dotted) configuration according to one or more embodiments of the disclosure.
Figure 2D:
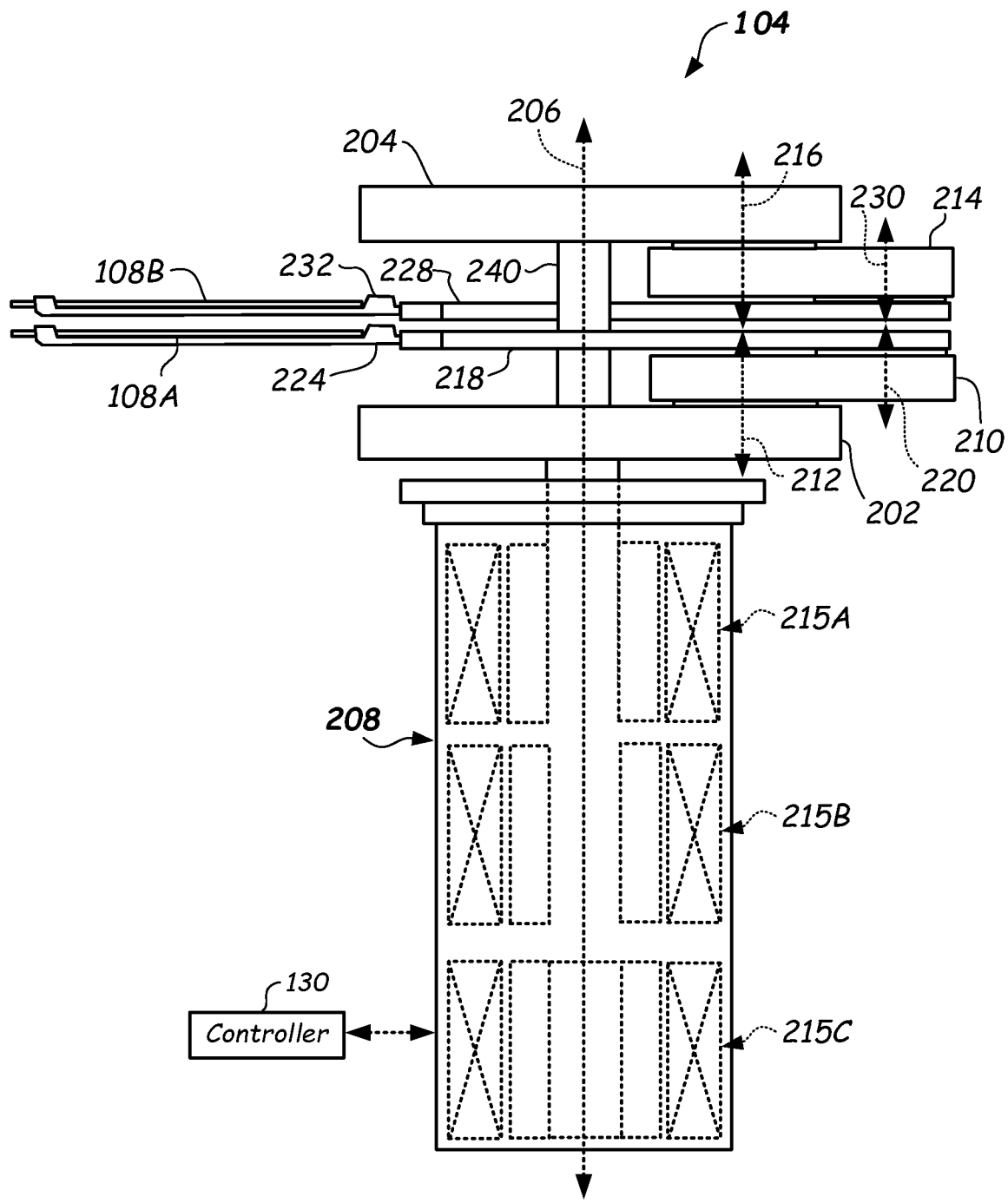
FIG. 2D illustrates a side plan view of a dual robot in a retracted configuration according to one or more embodiments of the disclosure.
Figure 2E:
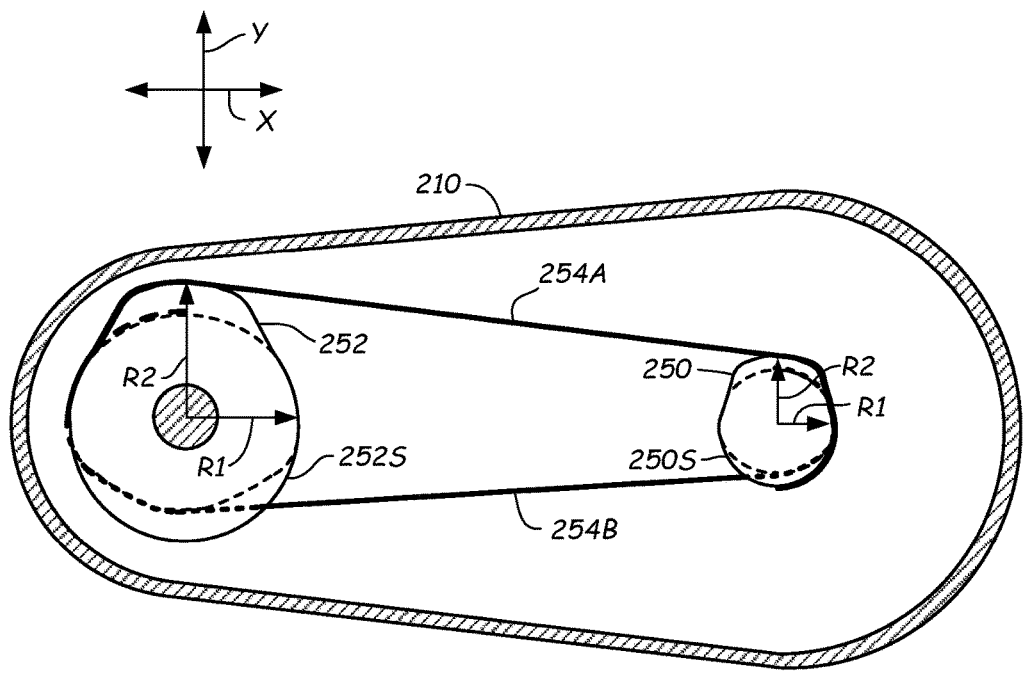
FIG. 2E illustrates a cross-sectioned top view of a forearm of a dual robot with cover removed and showing the forearm drive assembly according to one or more embodiments of the disclosure.
Figure 2F:
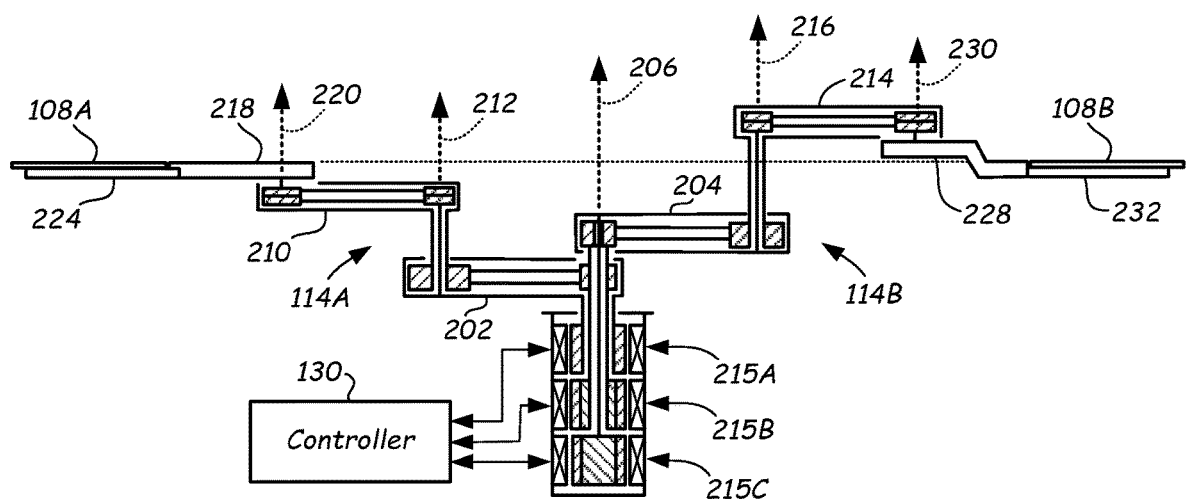
FIG. 2F illustrates a schematic side view of a dual robot showing the drive assemblies according to one or more embodiments of the disclosure.

Additional reference is now made to FIGS. 2A-2F. FIG. 2A illustrates a top plan view of an embodiment of the robot 104 shown in a fully retracted configuration (hereinafter "retracted" configuration). FIG. 2B illustrates a partial cross-sectioned top view of an embodiment of the robot 104 shown in the retracted configuration. FIG. 2C illustrates a top plan view of an embodiment of the robot 104 in one extended configuration, wherein both arm assemblies are simultaneously extended. FIG. 2D illustrates a side plan view of an embodiment of the robot 104 shown in the retracted configuration. FIG. 2E illustrates a cross-sectioned top view of an embodiment of wrist drive assembly. FIG. 2F illustrates a cross-sectioned side view of an embodiment of the robot 104 illustrating the drive assembly (with arm assemblies shown artificially extended 180 degrees apart for illustration purposes).

As described above, the robot 104 includes a first arm assembly 114A and a second arm assembly 114B. The first arm assembly 114A may include a first upper arm 202 and the second arm assembly 114B may include a second upper arm 204. Both the first upper arm 202 and the second upper arm 204 may be substantially rigid cantilever beams including forearm drive assembly components therein. The second upper arm 204 is spaced vertically above the first upper arm 202 and they are independently rotatable. In another aspect, the first upper arm 202 and the second upper arm 204 may be configured and adapted to be simultaneously rotated about a shoulder axis 206 (e.g., a first axis) relative to a motor housing 208 (FIG. 2D) in clockwise and counter-clockwise rotational directions. Rotation of the first upper arm 202 and the second upper arm 204 may be accomplished by a first motor 215A and third motor 215C located within the motor housing 208, as commanded by the controller 130 (FIG. 2D). The motor housing 208 can have an second rotational motor 215B interconnected to both the first forearm 210 and a second forearm 214. The second motor 215B is held stationary when the first and/or second upper arms 202, 204 are extended or retracted via operation of the first and third motors 215A, 215C. When in a fully-retracted orientation, the first arm assembly 1014A and second arm assembly 114B can be rotated to a new position along with synchronous rotation of the second motor 215B.

In the depicted embodiments of FIGS. 2A-2D, the shoulder axis 206 may be stationary in a vertical direction. This embodiment of the robot 104 may not include Z-axis capability and may be used with lift pins, moving platforms, or other like moveable substrate support structure in the process chambers 110 and/or load lock chambers 112 (FIG. 1) to accomplish such substrate exchanges. However, other embodiments of the robot 104 may include another motor and vertical drive assembly to accomplish Z-axis capability, wherein such Z-axis or vertical drive assemblies are known.

The first arm assembly 114A includes a first forearm 210 mounted and rotatably coupled to the first upper arm 202 at a second axis 212. The second axis 212 is spaced from the shoulder axis 206. The first forearm 210 is configured and adapted to be rotated in an X-Y plane relative to the first upper arm 202 about the second axis 212. Rotation of the first forearm 210 about the second axis 212 is dependent on the rotation of the first upper arm 202 about the shoulder axis 206. The first forearm 210 may be vertically located between the first upper arm 202 and the second upper arm 204.

The second arm assembly 114B includes a second forearm 214 mounted and rotatably coupled to the second upper arm 204 at a third axis 216. The third axis 216 is spaced from the shoulder axis 206. The second forearm 214 is configured and adapted to be rotated in the X-Y plane relative to the second upper arm 204 about the third axis 216. Rotation of the second forearm 214 about the third axis 216 is dependent on the rotation of the second upper arm 204 about the shoulder axis 206. The second forearm 214 may be vertically located between the first upper arm 202 and the second upper arm 204.

The first forearm 210 and second forearm 214 are configured and adapted to be rotated in either a clockwise or counterclockwise rotational direction about the second axis 212 and the third axis 216, respectively. Rotation may be +/− about 140 degrees. As shown in FIG. 2D the first forearm 210 and second forearm 214 are located at different vertical locations between the first upper arm 202 and the second upper arm 204 and do not interfere with one another when being independently rotated via rotation of the first upper arm 202 and/or the second upper arm 204.

The first arm assembly 114A includes a first wrist member 218 mounted and rotatably coupled to the first forearm 210 at a fourth axis 220. The fourth axis 220 is spaced from the second axis 212. The first wrist member 218 is configured and adapted to be rotated in an X-Y plane relative to the first forearm 210 about the fourth axis 220. Rotation of the first wrist member 218 about the fourth axis 220 may be dependent on the rotation of the first forearm 210 about the second axis 212. The first wrist member 218 may be vertically located between the first upper arm 202 and the second upper arm 204.

The first wrist member 218 may be coupled to a first end effector 224. In some embodiments, the first wrist member 218 and the first end effector 224 may be integral with one another, i.e., from a same piece of material. The first end effector 224 may be configured to carry and transport a substrate 108 (e.g., first substrate 108A) within the electronic device processing system 100 (FIG. 1).

Rotation of first wrist member 218, and thus the first end effector 224, may be imparted by a first wrist member drive assembly. The first wrist member 218 may be configured and adapted for rotation relative to the first forearm 210 in either a clockwise or counterclockwise rotational direction about the fourth axis 220 by the first wrist member drive assembly. Rotation may be +/− about 70 degrees. In particular, relative rotation between the first forearm 210 and the first upper arm 202 causes the first wrist member 218, coupled first end effector 224, and supported first substrate 108A to translate along a first path in an approximately first radial direction (See FIG. 2C). Such translation may be into one of the process chambers 110 as shown in FIG. 1, for example. However, it should be understood that the first wrist member drive assembly may be configured to include cammed pulleys that are configured to carry out a first path that is other than a purely radial path, such as a sweeping path.

The second arm assembly 114B includes a second wrist member 228 mounted and rotatably coupled to the second forearm 214 at a fifth axis 230. The fifth axis 230 is spaced from the third axis 216. The second wrist member 228 is configured and adapted to be rotated in an X-Y plane relative to the second forearm 214 about the fifth axis 230. Rotation of the second wrist member 228 about the fifth axis 230 may be dependent on the rotation of the second forearm 214 about the third axis 216. The second wrist member 228 may be vertically located between the first upper arm 202 and the second upper arm 204.

The second wrist member 228 may be coupled to a second end effector 232. In some embodiments, the second wrist member 228 and the second end effector 232 may be integral with one another, i.e., from a same piece of material. The second end effector 232 may be configured to carry and transport a substrate 108 within the electronic device processing system 100 (FIG. 1).

Translation of the second wrist member 228, and thus the second end effector 232 and supported substrate 108B, may be imparted by a second wrist member drive assembly. The second wrist member 228 is configured and adapted for rotation relative to the second forearm 214 in either a clockwise or a counterclockwise rotational direction about the fifth axis 230 by the second wrist member drive assembly. Rotation may be +/− about 70 degrees. In particular, relative rotation between the second forearm 214 and the second upper arm 204 can cause the second wrist member 228 and coupled second end effector 232 as well as the supported second substrate 108B to translate substantially radially along a second path. Such translation may be into one of the process chambers 110 as shown in FIG. 1, for example. However, it should be understood that the second wrist member drive assembly may be configured to include cammed pulleys to carry out a second path that is other than purely radial. As will be understood, the splayed orientation of the arm assemblies allows the substrates 108A, 108B to be carried on the first path and the second path that do not overlap.

As is shown in FIG. 2B and FIG. 2C, the first forearm 210, second forearm 214, first wrist member 218, and second wrist member 228 are all received between the vertical locations of the first upper arm 202 and the second upper arm 204. Furthermore, the first upper arm 202, first forearm 210, and first wrist member 218 are all arranged below the locations of the second upper arm 204, second forearm 214, and second wrist member 228, so that interference is avoided for all rotational conditions.

In one or more embodiments, the first upper arm 202 and the first forearm 210 may be of unequal lengths. For example, a length L21 (FIG. 2C) between the shoulder axis 206 and the second axis 212 on the first upper arm 202 may be greater than a length L22 between the second axis 212 and the fourth axis 220 on the first forearm 210.

The second upper arm 204 and second forearm 214 may also be of unequal lengths. For example, a length L23 between the shoulder axis 206 and the third axis 216 on the second upper arm 204 may be greater than a length L24 between the third axis 216 and the fifth axis 230 on the second forearm 214. In some embodiments, the lengths L21 and L23 of the first upper arm 202 and the second upper arm 204 may be between about 110% and 200% greater than the lengths L22 and L24 of the first forearm 210 and second forearm 214, respectively. In one or more embodiments, the lengths L21 and L23 of the first upper arm 202 and the second upper arm 204 may be between about 200 mm and about 380 mm. The lengths D22 and D24 of the first forearm 210 and the second forearm 214 may be between about 100 mm and 345 mm.

Additional reference is made to FIG. 2E, which illustrates a cross-sectioned view of the first forearm 210, which may be substantially similar to the second forearm 214. For example, the second forearm 214 may be a mirror image of the first forearm 210. In the depicted embodiment, the first forearm 210 may include a first wrist member drive assembly. The first wrist member drive assembly includes a first wrist member driving member 250, which comprises a cam surface 250S and a first wrist member driven member 252 connected by a first wrist member transmission element made up of belts 254A, 254B. The first wrist member driving member 250 may be an oblong pulley including the cam surface 250S. The first wrist member driving member 250 may be rigidly coupled to the first upper arm 202, such as by a shaft or by direct connection. Other types of rigid connections may be used. Likewise, the first wrist member driven member 252 may be an oblong pulley including the cam surface 252S and may be rigidly connected to the first wrist member 218.

The cam surfaces 250S, 252S of the first wrist member driving member 250 and the first wrist member driven member 252 may be configured so that rate of rotation of the first wrist member 218 is nonlinear. Thus, even though the lengths of the first upper arm 202 and the first forearm 210 are unequal, the first wrist member 218 and the coupled first end effector 224 can be driven in substantially pure translation in a substantially straight first path, if desired. In particular, the cam surfaces 250S, 252S, and thus the rate of rotation, is related to the center-to-center length L21 of the first upper arm 202 and the center-to-center length L22 of the first forearm 210. The relationship between a minimum cam radius R1 to a maximum cam radius R2 may be selected based upon the lengths of the first upper arm 202 and the second upper arm 204 and first and second forearms so that a substantially constant belt tension of belts 254A, 254B may be provided during rotation.

As discussed above, the trajectory for the first end effector 224 and the second end effector 232 may be linear in some embodiments, or optionally may be sweeping in some embodiments depending upon the chosen cam profile. The cam surfaces 250S and 252S may be oriented so that the positions of the lobes having the maximum radius are oriented in the same direction. Other lobe shapes may be used. The lobe profile, in some embodiments, is such that the first end effector 224 always travels in a linear path in extension and retraction. The operation of the second wrist member drive assembly configured to drive the second wrist member 228 may be identical to the above-described first wrist member drive assembly, but a mirror image thereof.

The first wrist member driven member 252 may be coupled to a pilot or shaft extending from a body of the first wrist member 218. In some embodiments, the one or more belts 254A, 254B may be discontinuous first and second steel belts, oppositely wrapped about the first wrist member driving member 250 and the first wrist member driven member 252.

The robot 104 may be configured such that the first substrate 108A and the second substrate 108B transported by the first end effector 224 and the second end effector 232 along the first and second paths so that the first substrate 108A and the second substrate 108B do not overlap during transport thereof. Such a configuration prevents debris from the second substrate 108B from falling onto the first substrate 108A. In some embodiments, no portion of the robot 104 is located above a substrate 108A, 108B during transport of the substrates 108A, 108B, further reducing the possibility of contamination falling onto the substrates 108A, 108B. The above-described configurations of the robot 104 may be achieved by the unique shapes and movements of the first wrist member 218, the second wrist member 228, and other components of the robot 104.

Referring to FIG. 2B, a shaft assembly 240 may extend to the second upper arm 204, wherein the shoulder axis 206 is located in the shaft assembly 240. The shaft assembly may rotate at least one of the first upper arm 202 and the second upper arm 204 and may include a shaft interconnecting the wrist member drive pulleys. The first wrist member 218 may include a first bend 218A that at least partially bends around the shaft assembly 240 so that the first wrist member 218 does not contact the shaft assembly 240. In a like manner, the second wrist member 228 may include a first bend 228A that at least partially bends around the shaft assembly 240 so that the second wrist member 228 does not contact the shaft assembly 240.

The first wrist member 218 may include a second bend 218B that bends in an opposite direction as the first bend 218A. The second bend 218B may maintain the first substrate 108A away from the second substrate 108B when the robot 104 is in the retracted configuration. In a like manner, the second wrist member 228 may include a second bend 228B that bends in an opposite direction as the first bend 228A. The second bend 228B may maintain the second substrate 108B away from the first substrate 108A when the robot 104 is in the retracted configuration.

The second bends 218B, 228B cause the first substrate 108A and the second substrate 108B to be spaced from each other so that they do not overlap. A splay angle $\theta$ may be located between a first axis 242A (FIG. 2A) extending through a center of the first end effector 224 and the shoulder axis 206 and a second axis extending through a center of the second end effector 232 and the shoulder axis 206. In some embodiments, the splay angle θ is between 40° and 175°. In some embodiments, the splay angle θ is between 50° and 165°. The splay angle θ, once set is generally fixed within limits to avoid overlap of the substrates 108A, 108B, or similarly to avoid any substantial overlap of any wrist or other arm surfaces or articulated joints over, in particular, the lower substrate.

The first arm assembly 114A and the second arm assembly 114B may transition (or be moveable) between the retracted configurations or retracted positions shown in FIGS. 2A and 2B and the extended configurations or extended positions shown in FIG. 2C. In the retracted positions, the end effectors 224, 232 are closer to the shoulder axis 206 than when the end effectors 224 232 are in the extended positions. In some embodiments, the travel distance of first end effector 224 and the second end effector 232 between the retracted configuration and the extended configuration may be in a range from 32 inches to 40 inches (81 cm to 12 cm) for standard chamber types and 42 inches to 54 inches (103 cm to 132 cm) for long-reach chamber types, for example.

As illustrated in FIG. 2C, the first end effector 224 and the first substrate 108A located thereon may travel along a first path 242 between the retracted configuration and the extended configuration. In a like manner, the second end effector 232 and the second substrate 108B located thereon may travel along a second path 244 between the retracted configuration and the extended configuration. As illustrated in FIG. 2C, the first path 242 and the second path 244 do not overlap. Accordingly, the second substrate 108B, which may be located at the same level (as shown in FIG. 2F by imparting a bend in an outer portion of one or more of the wrist members as shown), or vertically higher (as shown in FIG. 2D) than the first substrate 108A. Thus, in some embodiments, the arms do not pass over the first substrate 108A. Thus, debris from the second substrate 108B and/or the second end effector 232 will not fall onto the first substrate 108A during travel of either the first substrate 108A or the second substrate 108B.

The first forearm 210, the second forearm 214, the first wrist member 218, and the second wrist member 228 may pivot about their respective rotational axes during motions (e.g., substantial transition) between the retracted configuration and the extended configuration. During transition of the second arm assembly 114B from the retracted configuration illustrated in FIG. 2A to the extended configuration illustrated in FIG. 2C, a third motor 215C may cause rotation the second upper arm 204 in a counterclockwise direction about the shoulder axis 206 with second motor 215B being fixed (not moving). For example, the second upper arm 204 may rotate relative to the shaft assembly 240 (FIG. 2B). The rotation of the second upper arm 204 may cause the second forearm 214 to rotate in a clockwise direction about the third axis 216 as the second forearm extends along the second path 244. Gears, pulley, belts, cams, and the like may be employed to rotate the second forearm 214. Rotation of the second forearm 214 about the third axis 216 causes the second wrist member 228 to rotate in a counterclockwise direction about the fifth axis 230 as it extends along the second path 244.

The second arm assembly 114B may be retracted to the retracted configuration by rotating the second upper arm 204 in a clockwise direction about the shoulder axis 206 via operation of the third motor 215C with second motor 215B being fixed (not moving).

In a like manner, the first arm assembly 114A may transition from the retracted configuration of FIG. 2A to the extended configuration of FIG. 2C by rotation of the first upper arm 202 in a clockwise direction about the shoulder axis 206 via operation of the first motor 215A with second motor 215B being fixed (not moving) Likewise, the first arm assembly 114A may transition from the extended configuration to the retracted configuration by rotation of the first upper arm 202 in a counterclockwise direction about the shoulder axis 206 via operation of the first motor 215A with second motor 215B being fixed (not moving). The first upper arm 202 may be rotated independent of the second upper arm 204.

In order to move the second end effector 232 to a desired destination for a pick or place of the second substrate 108B, the second upper arm 204 and second forearm 214 may be actuated a sufficient amount to move (e.g., substantially translate) the second wrist member 228 to pick or place the second substrate 108B from a chamber. As the second end effector 232 coupled to the second wrist member 228 is inserted into a chamber (FIG. 1) to place the second substrate 108B at a desired destination location, moving lift pins may raise to contact the second substrate 108B and lift the second substrate 108B off of the second end effector 232 so that the second end effector 232 may be retracted.

In another aspect, a method of transporting substrates (e.g., substrates 108) within an electronic device processing system (e.g., system 100) can comprise: rotating a first upper arm of a first arm assembly of a robot, wherein the rotating causes the end effector of the first arm assembly to move along a first path; and rotating a second upper arm of a second arm assembly of the robot, wherein the rotating causes a second end effector of the second arm assembly to move along a second path, wherein the first end effector and the second end effector do not overlap when moving along the respective first and second paths.

Figure 3:
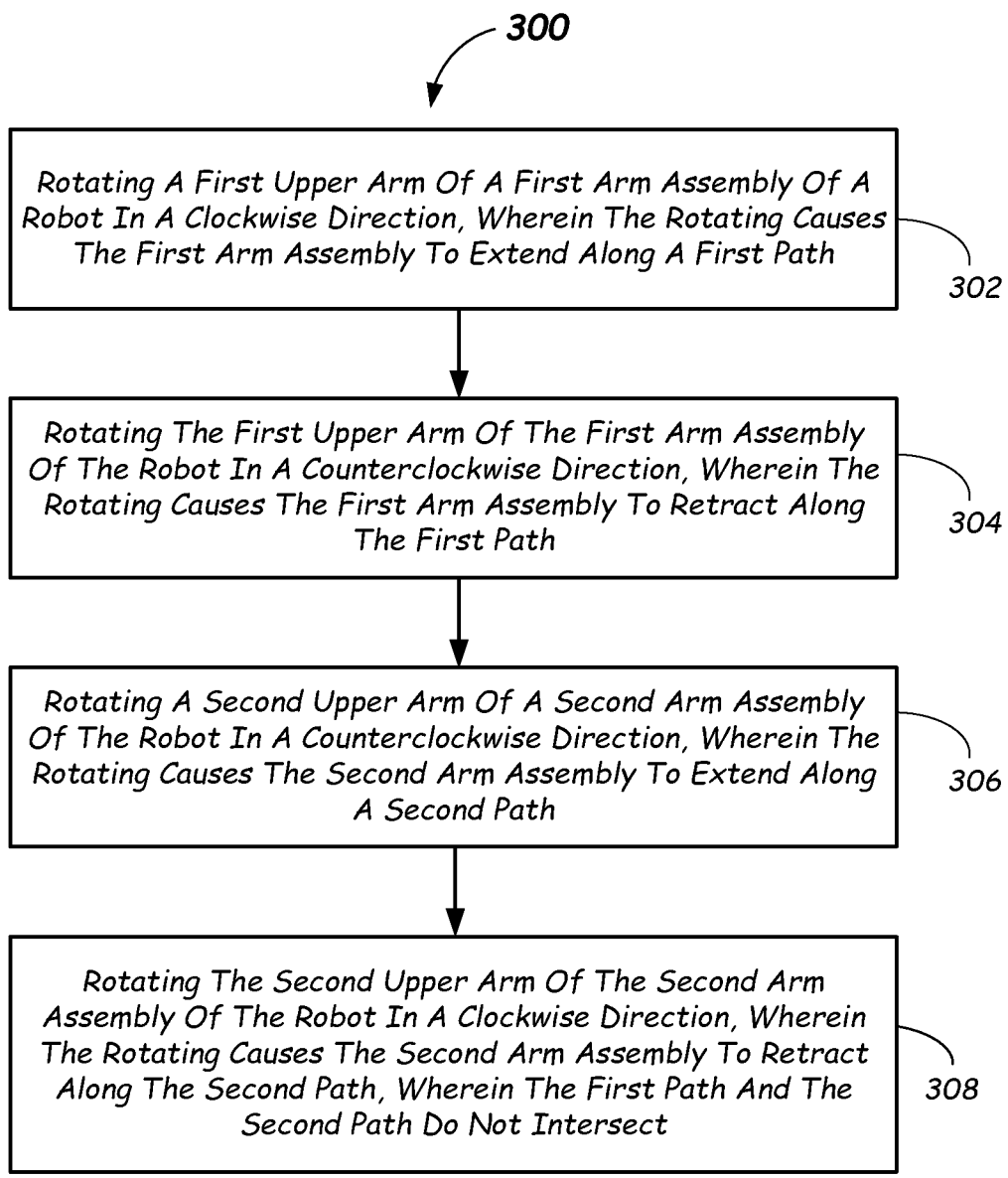
FIG. 3 illustrates a flowchart depicting a method of transporting substrates within an electronic device processing system according to one or more embodiments of the disclosure.

A method 300 of transporting substrates within an electronic device processing system according to embodiments is further provided and described with reference to FIG. 3. The method 300 includes, in 302, rotating a first upper arm (e.g., first upper arm 202) of a first arm assembly (e.g., first arm assembly 114A) of a robot (e.g., robot 104) in a clockwise direction, wherein the rotating causes the first arm assembly to extend along a first path (e.g., first path 242). The method 300 includes, in 304, rotating the first upper arm of the first arm assembly of the robot in a counterclockwise direction, wherein the rotating causes the first arm assembly to retract along the first path. The method 300 includes in 306, rotating a second upper arm (e.g., second upper arm 204) of a second arm assembly (e.g., second arm assembly 114B) of the robot in a counterclockwise direction, wherein the rotating causes the second arm assembly to extend along a second path (e.g., second path 244).

The method 300 includes, in 308, rotating the second upper arm of the second arm assembly of the robot in a clockwise direction, wherein the rotating causes the second arm assembly to retract along the second path, wherein the first path and the second path do not intersect. These extensions and retractions can be followed by rotation of the arm assemblies of the robot to new radial locations, wherein the rotation occurs with the splay angle being fixed via rotating all three motors in unison. In some embodiments, the splayed robot can perform a similar efficient swap move that is only slowed by the rotation between wafer pick and wafer place to substantially align the path of the second wafer and wrist member along the same path that the first wafer and wrist member traveled during the wafer pick so the second wafer can be placed at the same place from which the first wafer was picked.

As should be apparent, using the robot 104 as described herein, picking and placing of substrates may be accomplished in reduced time, thus enhancing overall tool throughput. Moreover, the number of motors may be reduced to three and only three, thus reducing the complexity and cost of the robot. The foregoing description discloses only example embodiments. Modifications of the above-disclosed apparatus, systems, and methods which fall within the scope of the disclosure will be readily apparent to those of ordinary skill in the art. Accordingly, while the present disclosure has been provided in connection with example embodiments thereof, it should be understood that other embodiments may fall within the scope, as defined by the claims.

What is claimed is:

1. A robot, comprising:
    a first arm assembly including:
        a first upper arm rotatable about a first axis;
        a first forearm adapted for rotation relative to the first upper arm about a second axis at a position spaced from the first axis, the first forearm comprising a first wrist member drive assembly;
        a first wrist member adapted for rotation relative to the first forearm about a third axis at a position spaced from the second axis; and
        a first end effector coupled to the first wrist member and configured to support a first substrate;
        wherein the first wrist member drive assembly is configured to rotate the first wrist member at a nonlinear rate and drive the first end effector in a first radial direction extending from the first axis along a first path; and
    a second arm assembly including:
        a second upper arm rotatable about the first axis;
        a second forearm adapted for rotation relative to the second upper arm about a fourth axis at a position spaced from the first axis, the second forearm comprising a second wrist member drive assembly, wherein the first forearm and the second forearm are vertically located between the first upper arm and the second upper arm;
        a second wrist member adapted for rotation relative to the second forearm about a fifth axis at a position spaced from the fourth axis; and
        a second end effector coupled to the second wrist member and configured to support a second substrate that does not overlap with the first substrate in any operating position of the first end effector or the second end effector,
        wherein the second wrist member drive assembly is configured to rotate the second wrist member at a nonlinear rate and drive the second end effector in a second radial direction extending from the first axis along a second path and wherein the first path and the second path do not overlap.

2. The robot of claim 1, wherein the first arm assembly is moveable between a retracted position and an extended position, wherein the first end effector is closer to the first axis when the first arm assembly is in the retracted position than when the first arm assembly is in the extended position.

3. The robot of claim 1, wherein the second arm assembly is moveable between a retracted position and an extended position, wherein the second end effector is closer to the first axis when the second arm assembly is in the retracted position than when the second arm assembly is in the extended position.

4. The robot of claim 1, wherein the first arm assembly and the second arm assembly are moveable between retracted positions and extended positions, and wherein the first end effector and the second end effector are closer to the first axis when the first arm assembly and the second arm assembly are in the retracted positions than when the first arm assembly and the second arm assembly are in the extended positions.

5. The robot of claim 4, wherein a first line extending through a center of the first end effector and the first axis is at a splay angle relative to a second line extending through a center of the second end effector and the first axis when the first arm assembly and the second arm assembly are in the retracted positions, and wherein the splay angle is between 40° and 175°.

6. The robot of claim 5, wherein the splay angle is between 50° and 165°.

7. The robot of claim 4, further comprising a shaft assembly configured to rotate at least one of the first upper arm and the second upper arm, wherein neither the first arm assembly nor the second arm assembly contact the shaft assembly when the first arm assembly and the second arm assembly are in the retracted positions.

8. The robot of claim 1, wherein a first length between the first axis and the second axis is greater than a second length between the second axis and the third axis.

9. The robot of claim 8, wherein the first length is between 110% and 200% greater than the second length.

10. The robot of claim 8, wherein the first length is between 200 mm and 380 mm.

11. The robot of claim 8, wherein the second length is between 100 mm and 345 mm.

12. The robot of claim 8, wherein a third length between the first axis and the fourth axis is greater than a fourth length between the fourth axis and the fifth axis.

13. The robot of claim 12, wherein the third length is between 110% and 200% greater than the fourth length.

14. The robot of claim 12, wherein the third length is between 200 mm and 380 mm.

15. The robot of claim 12, wherein the fourth length is between 100 mm and 345 mm.

16. The robot of claim 12, consisting of a number of motors numbering three and only three.

17. A robot comprising:
    a first arm assembly including:
        a first upper arm rotatable about a first axis;
        a first forearm adapted for rotation relative to the first upper arm about a second axis at a position spaced from the first axis;
        a first wrist member adapted for rotation relative to the first forearm about a third axis at a position spaced from the second axis; and
        a first end effector coupled to the first wrist member and configured to support a first substrate;
        wherein the first end effector is moveable in a first radial direction extending from the first axis along a first path;
    a second arm assembly including:
        a second upper arm rotatable about the first axis;
        a second forearm adapted for rotation relative to the second upper arm about a fourth axis at a position spaced from the first axis, wherein the first forearm and the second forearm are vertically located between the first upper arm and the second upper arm;

a second wrist member adapted for rotation relative to the second forearm about a fifth axis at a position spaced from the fourth axis; and a second end effector coupled to the second wrist member and configured to support a second substrate that does not overlap with the first substrate in any operating position of the first end effector or the second end effector, wherein the second end effector is moveable in a second radial direction extending from the first axis along a second path and wherein the first path and the second path do not overlap;

a shaft assembly configured to rotate at least one of the first upper arm and the second upper arm;

a first bend in the first wrist member; and a second bend in the second wrist member, wherein the first bend and the second bend at least partially bend around the shaft assembly when the first arm assembly and the second arm assembly are in retracted positions.

18. The robot of claim 17, wherein neither the first bend nor the second bend contact the shaft assembly when the first arm assembly and the second arm assembly are in the retracted positions.

19. An electronic device processing system, comprising:

a transfer chamber;

a robot at least partially disposed in the transfer chamber and adapted to transport substrates to and from process chambers coupled to the transfer chamber, the robot including:

a first arm assembly including:

a first upper arm rotatable about a first axis;

a first forearm adapted for rotation relative to the first upper arm about a second axis at a position spaced from the first axis, the first forearm comprising a first wrist member drive assembly;

a first wrist member adapted for rotation relative to the first forearm about a third axis at a position spaced from the second axis; and a first end effector coupled to the first wrist member and configured to support a first substrate, wherein the first wrist member drive assembly is configured to rotate the first wrist member at a nonlinear rate and drive the first end effector in a first radial direction extending from the first axis along a first path; and a second arm assembly including:

a second upper arm rotatable about the first axis;

a second forearm adapted for rotation relative to the second upper arm about a fourth axis at a position spaced from the first axis, the second forearm comprising a second wrist member drive assembly, wherein the first forearm and the second forearm are vertically located between the first upper arm and the second upper arm;

a second wrist member adapted for rotation relative to the second forearm about a fifth axis at a position spaced from the fourth axis; and a second end effector coupled to the second wrist member and configured to support a second substrate that does not overlap with the first substrate in any operating position of the first end effector or the second end effector, wherein the second wrist member drive assembly is configured to rotate the second wrist member at a nonlinear rate and drive the second end effector in a second radial direction extending from the first axis along a second path and wherein the first path and the second path do not overlap.

* * * * *